United States Patent [19]
Lee et al.

[11] Patent Number: 5,773,171
[45] Date of Patent: Jun. 30, 1998

[54] PHASE SHIFT MASK FOR FORMING CONTACT HOLES

[75] Inventors: Il Ho Lee; Hee Bom Kim, both of Kyoungki-do, Rep. of Korea

[73] Assignee: Hyundai Electronics Industries Co., Ldt., Kyoungki-do, Rep. of Korea

[21] Appl. No.: 864,105

[22] Filed: May 28, 1997

[30] Foreign Application Priority Data

Jun. 29, 1996 [KR] Rep. of Korea ................. 1996-25724

[51] Int. Cl.$^6$ ....................................................... G03F 9/00
[52] U.S. Cl. ................................................................. 430/5
[58] Field of Search ............................... 430/5, 322, 324

[56] References Cited

U.S. PATENT DOCUMENTS 5,370,975  12/1994  Nakatani .
5,458,998  10/1995  Takekuma et al. .
5,641,592   6/1997  Kim ............................................ 430/5

*Primary Examiner*—S. Rosasco
*Attorney, Agent, or Firm*—Gary M. Nath; Nath & Associates

[57] ABSTRACT

A phase shift mask for forming contact holes arranged in longitudinal, transversal and diagonal directions, capable of achieving an improvement in light contrast in the formation of contact holes, thereby forming a fine contact hole pattern. The phase shift mask includes a shifter formed on a transparent substrate and patterned to define windows respectively arranged at contact hole regions where the contact holes are formed. The windows consist of first windows each having a central portion defined by a portion of the shifter and an edge portion defined by an exposed portion of the substrate arranged around the portion of the shifter, and second windows each having a central portion defined by an exposed portion of the substrate and an edge portion defined by a portion of the shifter arranged around the exposed portion of the substrate. The first and second windows are arranged adjacent to each other in longitudinal and transversal directions while being arranged in an alternating manner in the diagonal direction, whereby each of the windows exhibits a minimum light intensity at the edge portion thereof and a maximum light intensity at the central portion thereof.

9 Claims, 2 Drawing Sheets

PHASE SHIFT MASK FOR FORMING CONTACT HOLES

BACKGROUND OF THE INVENTION

1. Field of the Invention

The present invention relates to a phase shift mask for forming contact holes of a semiconductor device, and more particularly to such a phase shift mask including a shifter patterned to define diamond-shaped windows each having central and edge portions on which the shifter is selectively disposed to form fine contact holes regularly arranged in longitudinal, transversal and diagonal directions.

2. Description of the Prior Art

In order to improve the profile of a pattern formed using a lithography process in the fabrication of a semiconductor device, a phase shift mask has been proposed which is selectively provided with a shifter, namely, a material for shifting the phase of light transmitting a transparent substrate of the mask.

FIG. 1 is a plan view illustrating a conventional phase shift mask used for the formation of contact holes. As shown in FIG. 1, the phase shift mask includes a transparent substrate 1 and a chromium film 2 coated over the transparent substrate 1. The phase shift mask is also provided with square windows 4 which are formed by removing the chromium film 2 from portions of the transparent substrate 1 respectively corresponding to contact hole regions where contact holes are formed, respectively, in such a manner that they are arranged in longitudinal, transversal and diagonal directions. The phase shift mask further includes shifters 3 respectively formed on selected windows 4 so that adjacent windows in the transversal direction have different phases.

In other words, windows 4 arranged in the transversal direction are provided with shifters 3 in an alternating manner. However, such an alternating arrangement of shifters 3 is not obtained in the longitudinal and diagonal directions. That is, adjacent windows 4 in the longitudinal or diagonal direction have shifters 3, respectively, or have no shifter.

FIG. 2 is a schematic view illustrating the distribution of light on a wafer when a light exposure process is carried out using the mask shown in FIG. 1. In this case, the intensity of light corresponds to 0.3 or less.

Although the above-mentioned conventional phase shift mask includes shifters arranged in an alternating manner at adjacent contact holes in the transversal direction in order to achieve an improvement in the contrast of light, it is impossible to expect such an improvement in contrast at adjacent contact holes in the longitudinal or diagonal direction because those contact holes adjacent to each other in the longitudinal or diagonal direction have shifters, respectively, or have no shifter, thereby exhibiting the same phase. As a result, a reduction in the contrast of light occurs. Consequently, it is impossible to obtain a contact hole pattern having good quality.

SUMMARY OF THE INVENTION

An object of the invention is to provide a phase shift mask for the formation of contact holes which includes a shifter patterned to define a regular array of diamond-shaped windows each having central and edge portions on which the shifter is selectively disposed so that adjacent windows exhibit different phases, thereby being capable of forming fine contact holes regularly arranged in longitudinal, transversal and diagonal directions.

In accordance with the present invention, this object is accomplished by providing a phase shift mask for forming contact holes arranged in longitudinal, transversal and diagonal directions, comprising: a transparent substrate; a shifter formed on the transparent substrate and patterned to define windows respectively arranged at contact hole regions where the contact holes are formed; and the windows consisting of first windows each having a central portion defined by a portion of the shifter and an edge portion defined by an exposed portion of the substrate arranged around the portion of the shifter, and second windows each having a central portion defined by an exposed portion of the substrate and an edge portion defined by a portion of the shifter arranged around the exposed portion of the substrate, the first and second windows being arranged adjacent to each other in longitudinal and transversal directions while being arranged in an alternating manner in the diagonal direction, whereby each of the windows exhibits a minimum light intensity at the edge portion thereof and a maximum light intensity at the central portion thereof.

Since the shifter is patterned so that each of the windows exhibits a minimum light intensity at the edge portion thereof and a maximum light intensity at the central portion thereof, it is possible to achieve an improvement in light contrast, thereby forming fine contact holes.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
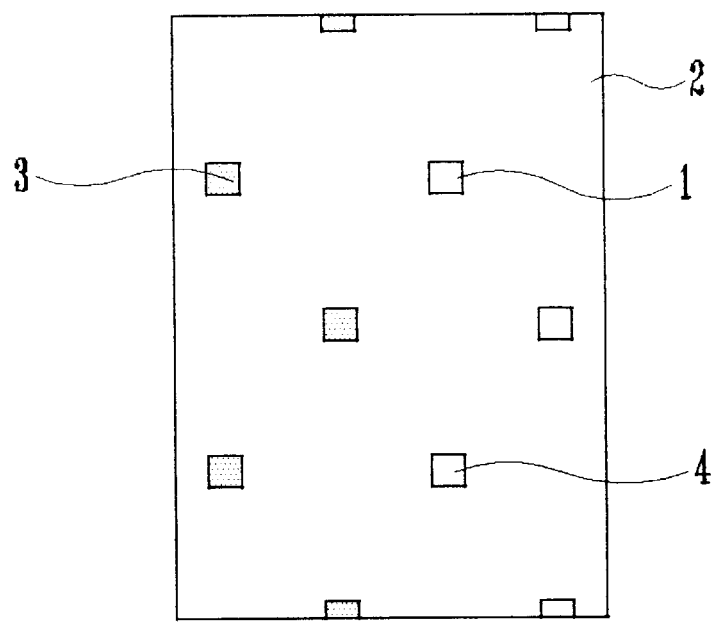
FIG. 1 is a plan view illustrating a conventional phase shift mask used for the formation of contact holes.
Figure 2:
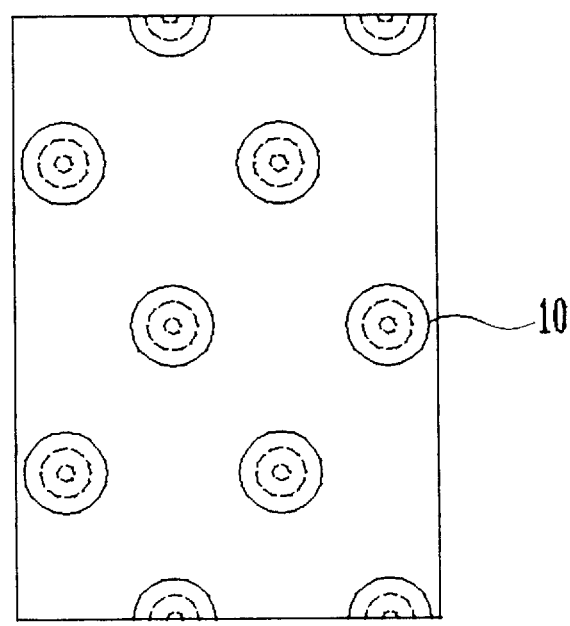
FIG. 2 is a schematic view illustrating the distribution of light on a wafer when a light exposure process is carried out using the mask shown in FIG. 1.
Figure 3:
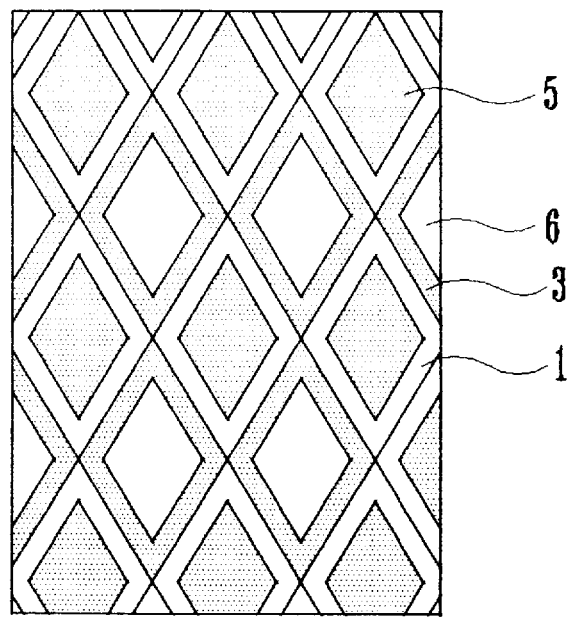
FIG. 3 is a plan view illustrating a phase shift mask for the formation of contact holes fabricated in accordance with the present invention.

Referring to FIG. 3, a phase shift mask for the formation of contact holes fabricated in accordance with the present invention is illustrated.

As shown in FIG. 3, the phase shift mask includes a transparent substrate 1 and a shifter 3 formed on the transparent substrate 1. The shifter 3 is patterned to define diamond-shaped windows arranged at contact hole regions, respectively. In order to obtain a minimum light intensity at boundaries of the windows, the edge portions of the windows are defined by portions of the shifter 3 and exposed portions of the transparent substrate 1 respectively corresponding to removed portions of the shifter 3.

In other words, the diamond-shaped windows are arranged in a regular manner in longitudinal and transversal directions.

In the illustrated case, the windows include first windows 5 each having a central portion defined by a diamond-shaped portion of the shifter 3 and an edge portion defined by an exposed portion of the substrate 1 arranged around the diamond-shaped portion of the shifter 3, and second windows 6 each having a central portion defined by a diamond-shaped exposed portion of the substrate 1 and an edge portion defined by a portion of the shifter 3 arranged around the diamond-shaped exposed portion of the substrate 1. The first and second windows 5 and 6 are arranged adjacent to each other in longitudinal and transversal directions while being arranged in an alternating manner in the diagonal direction.

The width of shifter portions left at or removed from edges of the windows is determined in such a manner that an accurate contact hole pattern is formed at a predetermined light exposure energy. That is, the width of the shifter portions should be determined so that a minimum light intensity is exhibited at edges of the diamond-shaped windows.

In each window, a difference in the phase of light is generated between the shifter 3 and transparent substrate 1. For example, a phase shift of 180° is desirably generated.

Figure 4:
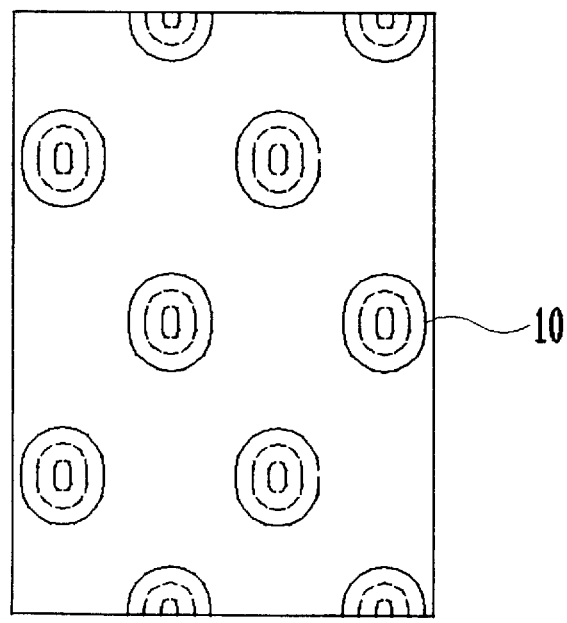
FIG. 4 is a schematic view illustrating the distribution of light on a wafer when a light exposure process is carried out using the mask shown in FIG. 3.

FIG. 4 shows the distribution of light on a wafer when a light exposure process is carried out using the mask shown in FIG. 3. In this case, the intensity of light corresponds to about 1.8. Although the distribution of light is exhibited in the form of an oval shape, it has no affect on the formation of accurate contact holes.

The phase shift mask, which includes first and second diamond-shaped windows as mentioned above, can be used irrespective of positive or negative resist materials. In association with this phase shift mask, it is possible to use a light source having, for example, a wavelength of i-line (365 nm), far ultraviolet ray (248 nm) or a shorter wavelength.

Since light generates a phase shift of 180° at the edges of the first and second windows, an offset interference of the light occurs at those edges. As a result, the intensity of light approximates to zero at the edge of each window and increases greatly at the center of the window. Accordingly, it is possible to obtain light contrast required for the formation of accurate contact holes.

The light contrast and the size of contact holes vary by the size of the diamond-shaped central and edge portions of each window. Accordingly, the phase shift mask of the present invention can be applied to the formation of various contact hole patterns by varying the sizes of the diamond-shaped central and edge portions of each window.

As is apparent from the above description, the present invention provides a phase shift mask including a plurality of diamond-shaped windows which is defined by a shifter patterned in such a manner that it is left at the inner and outer portions of the windows in an alternating manner. Accordingly, it is possible to achieve an improvement in light contrast, thereby forming fine contact holes.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A phase shift mask for forming contact holes arranged in longitudinal, transversal and diagonal directions, comprising:

a transparent substrate;

a shifter formed on the transparent substrate and patterned to define windows respectively arranged at contact hole regions where the contact holes are formed; and the windows consisting of first windows each having a central portion defined by a portion of the shifter and an edge portion defined by an exposed portion of the substrate arranged around the portion of the shifter, and second windows each having a central portion defined by an exposed portion of the substrate and an edge portion defined by a portion of the shifter arranged around the exposed portion of the substrate, the first and second windows being arranged adjacent to each other in longitudinal and transversal directions while being arranged in an alternating manner in the diagonal direction, whereby each of the windows exhibits a minimum light intensity at the edge portion thereof and a maximum light intensity at the central portion thereof.

2. The phase shift mask in accordance with claim 1, wherein the shifter is made of a material with a thickness capable of exhibiting minimum light intensity at a boundary between adjacent portions of the shifter and transparent substrate in accordance with a difference in phase occurring between light transmitting the shifter and light transmitting the transparent substrate.

3. A phase shift mask for forming contact holes arranged in longitudinal, transversal and diagonal directions, comprising:

a transparent substrate;

a shifter formed on the transparent substrate and patterned to define diamond-shaped windows respectively arranged at contact hole regions where the contact holes are formed; and the windows consisting of first windows each having a central portion defined by a portion of the shifter and an edge portion defined by an exposed portion of the substrate arranged around the portion of the shifter, and second windows each having a central portion defined by an exposed portion of the substrate and an edge portion defined by a portion of the shifter arranged around the exposed portion of the substrate, the first and second windows being arranged in such a manner that each of the windows exhibits a minimum light intensity at the edge portion thereof and a maximum light intensity at the central portion thereof.

4. The phase shift mask in accordance with claim 3, wherein the first and second windows are arranged adjacent to each other in longitudinal and transversal directions while being arranged in an alternating manner in the diagonal direction.

5. The phase shift mask in accordance with claim 3, wherein the shifter is made of a material capable with a thickness capable of exhibiting minimum light intensity at a boundary between adjacent portions of the shifter and transparent substrate in accordance with a difference in phase occurring between light transmitting the shifter and light transmitting the transparent substrate.

6. The phase shift mask in accordance with claim 5, wherein the portions of the shifter and transparent substrate respectively disposed at the edge portions of the windows have a width determined so that a minimum light intensity is exhibited at a boundary between adjacent portions of the shifter and transparent substrate.

7. A phase shift mask for forming contact holes arranged in longitudinal, transversal and diagonal directions, comprising:

a transparent substrate;

a shifter formed on the transparent substrate and patterned to define diamond-shaped windows respectively arranged at contact hole regions where the contact holes are formed; and the windows arranged in such a manner each of the windows exhibits a minimum light intensity at the edge portion thereof and a maximum light intensity at the central portion thereof.

8. The phase shift mask in accordance with claim 7, wherein the windows consists of first windows each having a central portion defined by a portion of the shifter and an edge portion defined by an exposed portion of the substrate arranged around the portion of the shifter, and second windows each having a central portion defined by an exposed portion of the substrate and an edge portion defined by a portion of the shifter arranged around the exposed portion of the substrate.

9. The phase shift mask in accordance with claim 7, wherein the first and second windows are arranged adjacent to each other in longitudinal and transversal directions while being arranged in an alternating manner in the diagonal direction.

* * * * *